United States Patent [19]
Hawkins

[11] Patent Number: 5,371,395
[45] Date of Patent: Dec. 6, 1994

[54] HIGH VOLTAGE INPUT PAD PROTECTION CIRCUITRY

[75] Inventor: William G. Hawkins, Webster, N.Y.

[73] Assignee: Xerox Corporation, Stamford, Conn.

[21] Appl. No.: 879,626

[22] Filed: May 6, 1992

[51] Int. Cl.$^5$ .......................... H01L 23/62
[52] U.S. Cl. .................. 257/361; 257/356; 257/357; 257/360; 257/362
[58] Field of Search ............ 361/91; 357/23.8, 23.11, 357/23.13; 437/59, 47; 257/356, 357, 360, 361, 362

[56] References Cited

U.S. PATENT DOCUMENTS

| | | | |
|---|---|---|---|
| 4,602,267 | 7/1986 | Shirato | 357/23.13 |
| 4,616,243 | 10/1986 | Minato et al. | 357/23.13 |
| 4,725,915 | 2/1988 | Jwahashi et al. | 361/91 |
| 4,803,536 | 2/1989 | Tuan | 357/23.13 |
| 4,890,187 | 12/1989 | Tailliet et al. | 357/23.13 |
| 4,893,157 | 1/1990 | Miyazawa et al. | 357/23.13 |
| 4,947,192 | 8/1990 | Hawkins et al. | 357/59 |
| 4,987,465 | 1/1991 | Longcor et al. | 357/23.13 |
| 4,990,984 | 2/1991 | Misu | 357/23.13 |
| 5,027,252 | 6/1991 | Yamamura | 357/23.13 |
| 5,075,250 | 12/1991 | Hawkins et al. | 437/47 |

FOREIGN PATENT DOCUMENTS

| | | | |
|---|---|---|---|
| 56-50527 | 5/1981 | Japan | 357/23.13 |
| 63-248170 | 10/1988 | Japan | 357/23.13 |
| 1-10657 | 1/1989 | Japan | 357/23.13 |
| 2-27738 | 1/1990 | Japan | 357/23.13 |

*Primary Examiner*—Steven Ho Yin Loke
*Attorney, Agent, or Firm*—Oliff & Berridge

[57] ABSTRACT

An electrostatic discharge (ESD) protection device for protecting a high voltage operating circuit having a high voltage input terminal is disclosed. The ESD protection circuit has a substrate, a first diffusion region formed in the substrate connected to the high voltage input terminal, a second diffusion region formed in the substrate connected to ground, a field oxide layer over the substrate having a thickened region extending into the substrate between the first and second diffusion regions, and a drift region formed in the substrate and located between the first diffusion region and the thickened field oxide layer. These regions are so arranged to move the point of avalanche breakdown away from the first diffusion/field oxide interface, so that the avalanche breakdown voltage is lower than that of the protected circuit while simultaneously preventing avalanche included bipolar feedback in the protection device.

20 Claims, 11 Drawing Sheets

HIGH VOLTAGE INPUT PAD PROTECTION CIRCUITRY

BACKGROUND OF THE INVENTION

1. Field of the Invention

The present invention relates generally to electrostatic discharge (ESD) protection of integrated circuits. More particularly, the invention relates to ESD protection of high voltage power (>b 25 V) input terminals, and especially for applications where power devices are used in conjunction with printing elements to form a customer replacable unit such as a printhead or print cartridge which will be handled in a wide variety of environments that are hostile to semiconductor components.

2. Description of Related Art

Semiconductor devices have become increasingly susceptible to damage by ESD events as the scale of the devices has decreased. The increased static sensitivity has been addressed by on chip protection circuits which protect inputs to about 2 to 4 kV [as measured by the Human Body Model (HBM)] in conjunction with stringent circuit handling precautions. In a consumer environment, such as an office, ESD events of up to 10 KV (HBM) are not uncommon. Such high-level ESD events are easily sufficient to destroy normal circuit components. In electronic devices, such as thermal ink jet printers or the like, which are designed to have easily replaceable electronic modules for on-site repair, high ESD hardness is necessary in order to prevent the replacement modules from being damaged as (or even before) they are installed in the electronic device. Previous inventions, for example U.S. Pat. Nos. 4,947,192 and 5,075,250 to Hawkins and Burke and to the same asignee as this application, disclose methods for integrating printing elements with control logic and power transistors switches. Integration of control logic dramatically reduces the number of connections which need to be made to the printhead, but adds the requirement of robust static protection.

Numerous conventional systems are known for ESD protection of semiconductor and MOS devices. The inputs of MOS integrated circuits are capacitors whose two electrodes are the MOS transistor device channel and the gate electrode material, usually polysilicon. The two capacitor electrodes are separated by silicon dioxide, which is usually grown on the device channel by high temperature oxidation processes. The MOS transistors use a thin silicon dioxide gate insulator to achieve high performance, and this thin oxide is susceptable to catastrophic, irreversable breakdown if the voltage across the dielectric is raised above 20 to 100 volts, depending on device fabrication details. In general, such circuits use monolithically integrated protective transistors built into the semiconductor circuit to protect the gates of the devices. These protective transistors are arranged to allow a high voltage static discharge transient to pass to ground prior to reaching the protected circuit. For example, U.S. Pat. No. 4,990,984 to Misu discloses a conventional protective transistor ESD protection device for an integrated circuit.

Such systems have at least three disadvantages which prevent them from being applied as protection of high voltage power input terminals. First, the conventional protective transistor for the circuit has only a small current carrying capacity, so that ESD surges which are encountered in the office environment will overwhelm the protective transistor, allowing a part of the ESD surge to reach the protected circuit or causing failure of the ESD protection circuit itself. Second, conventional protective transistors are designed to protect logic input terminals, which have a low current signal input voltage of 5 V. Accordingly, these protective transistors are designed to break down at 15 to 25 V. Advanced VLSI technologies utilize reduced gate dielectric thickness and CMOS fabrication, so the industry trend is to reduce the voltage at which ESD input protection structures breakdown, since the gate dielectric becomes more susceptable to breakdown as it becomes thinner. Such conventional ESD protective circuits are worthless when attempting to protect high voltage (>25 V) input terminals. Finally, protection circuits for logic input gates use diffused resistors which have values of several hundred ohms to slow ESD current transients. Such high impedence is not useful for power input pad applications.

In U.S. Pat. Nos. 5,027,252 to Yamamura and 4,616,243 to Minato et al., the first disadvantage of the conventional ESD protective transistors for semiconductor circuit gates is addressed by providing a multiple stage protective circuit. Yamamura teaches use of a three stage protection circuit, as shown in their FIG. 6 and 7. The first stage is a punch through device under field oxide, and is connected directly to the input pad. The second stage is isolated from the first stage by a current limiting diffused resistor and is a thick oxide device with it's gate tied to the input pad. The diffused resistor is situated between the gate connection and the drain, and the device source is tied to ground. A second diffused resistor is then followed by the third stage, where a conventional n-channel device with it's gate and source tied to ground is used to discharge any remaining voltage to ground. Minato teaches techniques for protecting p-well CMOS logic inputs. A polysilicon current limiting resistor is connected to the input pad and is followed by an n-channel device which is placed in a p-well that is specifically tailored to breakdown before normal p-well transistors. The breakdown voltage is lowered by raising the doping level of the protective transistor p-well, diffusing the p-well to a shallower depth, or adding diffused features which reduce p-well breakdown by other methods.

However, use of a punch-through type protection transistor with a high voltage input terminal for a MOS power driver is not practical for several reasons. First, the approach is limited to CMOS-type circuitry, while power MOS devices may employ either CMOS or NMOS architecture and circuitry. Secondly, all the proposed input circuits utilize diffused or polysilicon resistors with substantial attendent input impedence, and which would therefore seriously limit the ability of the input connection to supply a tightly regulated voltage over the range of current flows typically required for power applications. Finally, these input protection circuits breakdown at voltages which are far below that required for the present applications, as is shown in FIG. 4 of U.S. Pat. No. 4,616,243, where breakdown occurs between 10 and 15 Volts.

U.S. Pat. No. 4,725,915 to Jwahashi discloses a protection circuit for protecting the drain of a CMOS circuit having a higher voltage (>5 V, but <25 V) input terminal, by providing a higher breakdown voltage (~26 V) transistor and a resistor in parallel with the drain of a transistor of the protected circuit. In this case, the circuit to be protected is used for writing of EPROM's, where there is a high writing voltage applied. The drain of the transistor connected to the write voltage is an offset gate device with a drift region 4 between the gate 6 and the diffusion 2, as shown in their FIG. 2. The protection transistor has a lower breakdown voltage than the protected offset gate circuit because a thicker gate insulation layer 13 is combined together with abutting diffusion 12 directly against the gate electrode 14, as seen in their FIG. 4, while the gate insulation layer provided on the transistors in the protected circuits is substantially thinner but the diffusion is offset from the gate electrode by a drift region. The resistor is connected in series with the protective transistor and in a common gate-source configuration and to ground. However, as shown in FIG. 5 of Jwahashi, the protection circuit can withstand ESD voltages up to only about 450 V before the protected circuit is damaged, and such a modest level of protection still requires 50 ohms of resistance.

SUMMARY OF THE INVENTION

It is therefore an object of the present invention to provide a novel ESD protection circuit for high voltage input terminals.

It is another general object of the present invention to provide an ESD protection circuit which is able to withstand one order of magnitude higher ESD voltage discharges than conventional ESD protection circuits.

It is yet another general object of the present invention to provide a novel ESD protection circuit which breaks down at a lower voltage than the power MOS devices comprising the protected circuit.

It is a further general object of the present invention to provide a novel ESD protective circuit having low pad input impedance.

To achieve the foregoing and other objects in accordance with, the purpose of the present invention, as embodied and broadly described herein, the ESD protection circuit comprises an ESD protection transistor connected, in parallel with at least one power MOS driver, to a high- voltage input terminal, the input terminal connected to the drain of at least one power MOS driver. The ESD protection transistor has a structure which encourages lateral bipolar action, with a thick field oxide layer and an n− drift region located between the source and the drain.

Additional objects and novel features of the present invention shall be set forth in the following description and will become apparent to those skilled in the art upon examination of the following. The objectives and advantages of the invention may be realized and obtained by the means and combinations particularly pointed out in the appended claims.

BRIEF DESCRIPTION OF THE DRAWINGS

The preferred embodiments are described with reference to the drawings, in which like elements have been denoted with like reference numerals throughout the figures and in which:

FIG. 6c is a cross sectional view of the ESD protection device of the present invention taken through the plane 6c—6c of FIG. 6a.

DETAILED DESCRIPTION OF THE PREFERRED EMBODIMENTS

Figure 1:
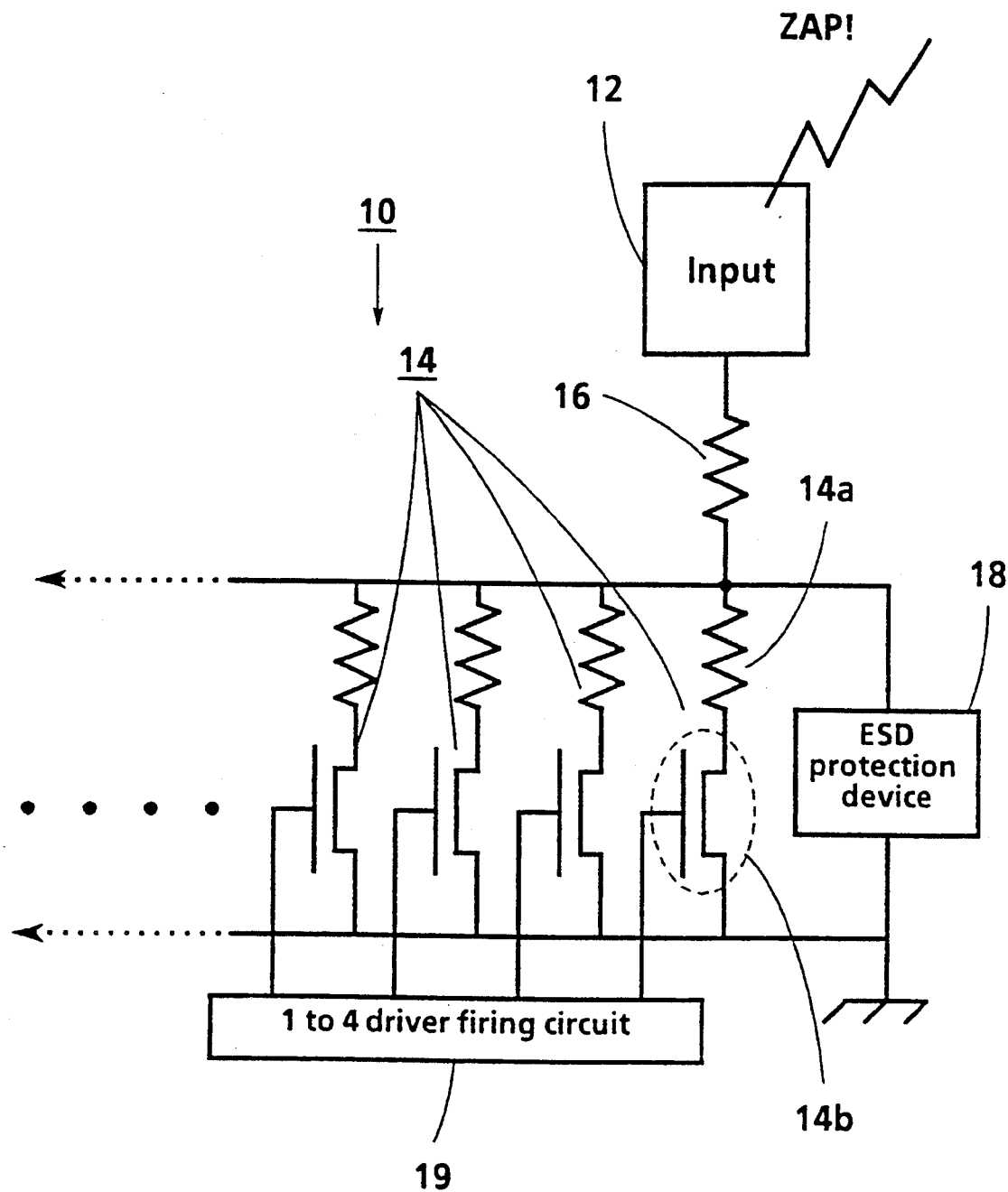
FIG. 1 is a schematic view of a circuit containing the ESD protection device of the present invention.
Figure 2:
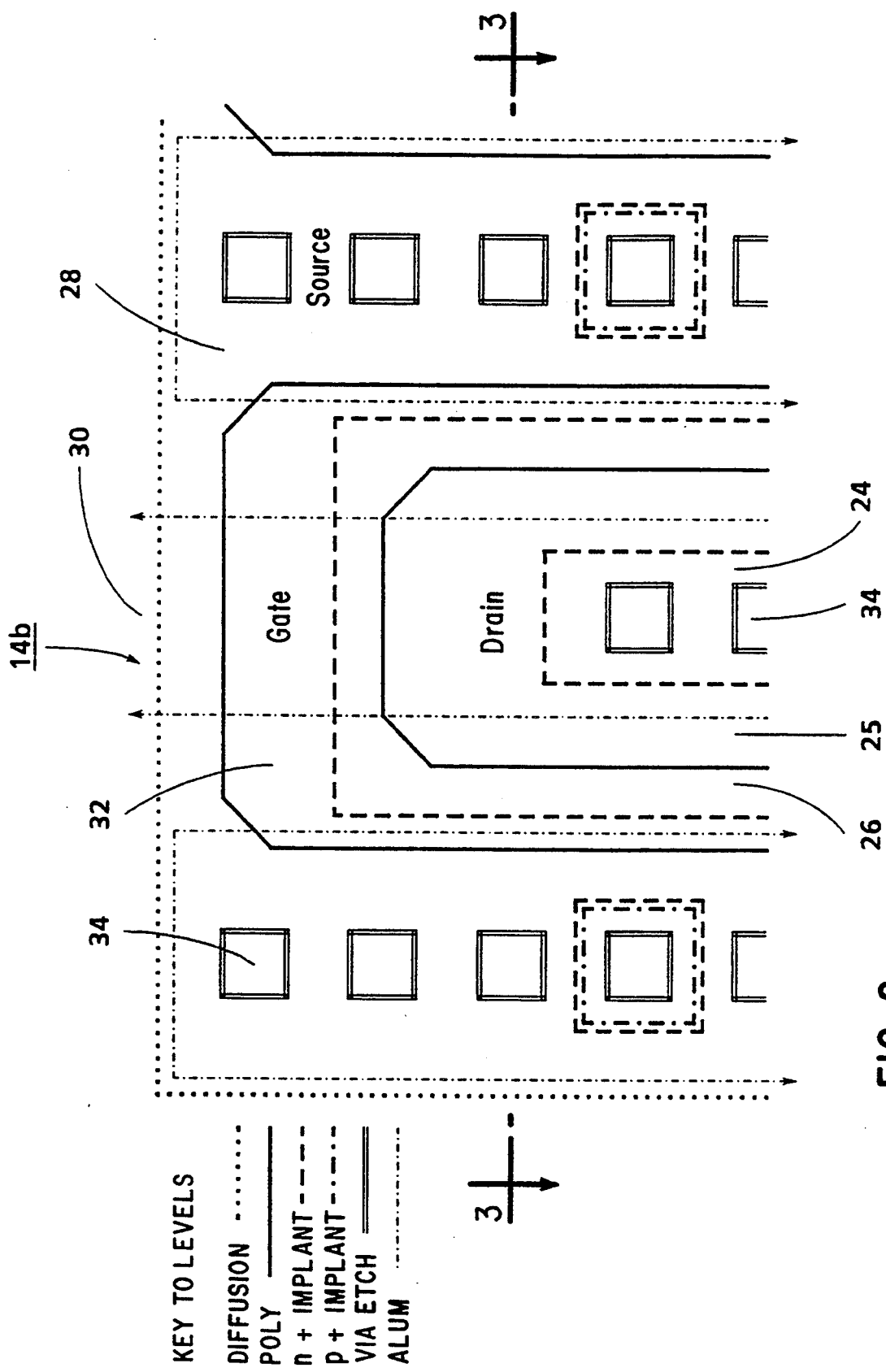
FIG. 2 is a plan view of a MOS power driver of FIG. 1.
Figure 3:
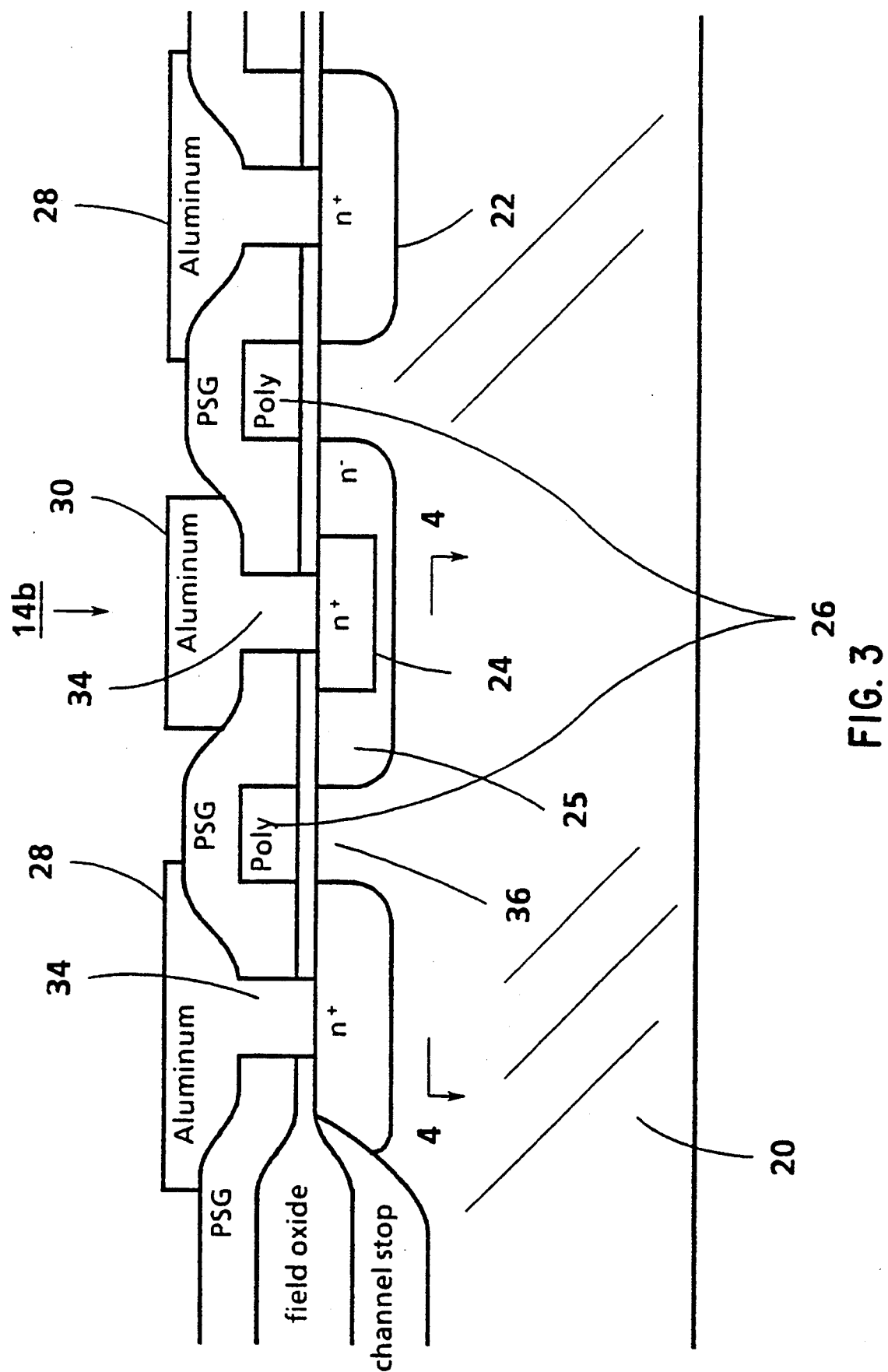
FIG. 3 is a cross sectional view through plane 3—3 of FIG. 2.

Referring to FIGS. 1-3, a semiconductor or MOS integrated circuit 10 comprises a high voltage input terminal 12 and input impedance 16, a number of semiconductor circuit elements 14 comprising the protected circuit and an electrostatic discharge (ESD) protection device 18. The input impedance 16 represents the various parasitic resistances arising from the input terminal and the input line, and in a preferred embodiment has a resistance less than 10 $\Omega$.

In the preferred embodiment, there are a plurality of blocks of 2 or more circuit elements 14, each comprising a load 14a, such as a resistive heater element, and a power MOS driver 14b. Other alternative embodiments of this invention could utilize bipolar devices and have alternative configurations and combinations of circuit elements. In the preferred embodiment, the load 14a is a 150 $\Omega$ resistive heating element for a thermal ink jet printer printhead. In the thermal ink jet printhead of the preferred embodiment, and in general, the heaters 14a of the individual power MOS drivers 14b must be heated the same amount independent of whether a particular resistor 14a is being used alone or in conjunction with other resistors 14a. That is, it is important that the same heat energy, within a few percent, be delivered whether one or more heaters are simultaneously activated by control circuitry 19. As each resistive heating element 14a is approximately 150 $\Omega$, the lumped resistance of the circuit of FIG. 1 is approximately 40 $\Omega$. Accordingly, the input impedance 16 must be less than 100 $\Omega$, should be less than 10 $\Omega$, and is preferably less than 1 $\Omega$.

In the preferred embodiment of a 300 spi thermal ink jet printer, the circuit elements 14 operate at a voltage of 20 V–100 V and a current of 200 mA–800 mA. In additional embodiments providing densities up to 1200 spi, the circuit elements will operate at a lower current. For example it is anticipated that a 800–1200 spi printhead will operate on a current on the order of 50 mA. While it is recognized that other applications may not require the high current sourcing of the preferred embodiment, it is obvious that the resistance 16 of the input 12 in a power circuit must be kept low. A thermal ink jet printer of the preferred embodiment may contain many blocks of circuit elements 14, such as 32 blocks (for 128 jet printheads) or 48 blocks (for 192 jet printheads). A 384 jet printhead (96 blocks) which is able to fire up to 8 circuit elements 14 at once has also been built.

Figure 6A:
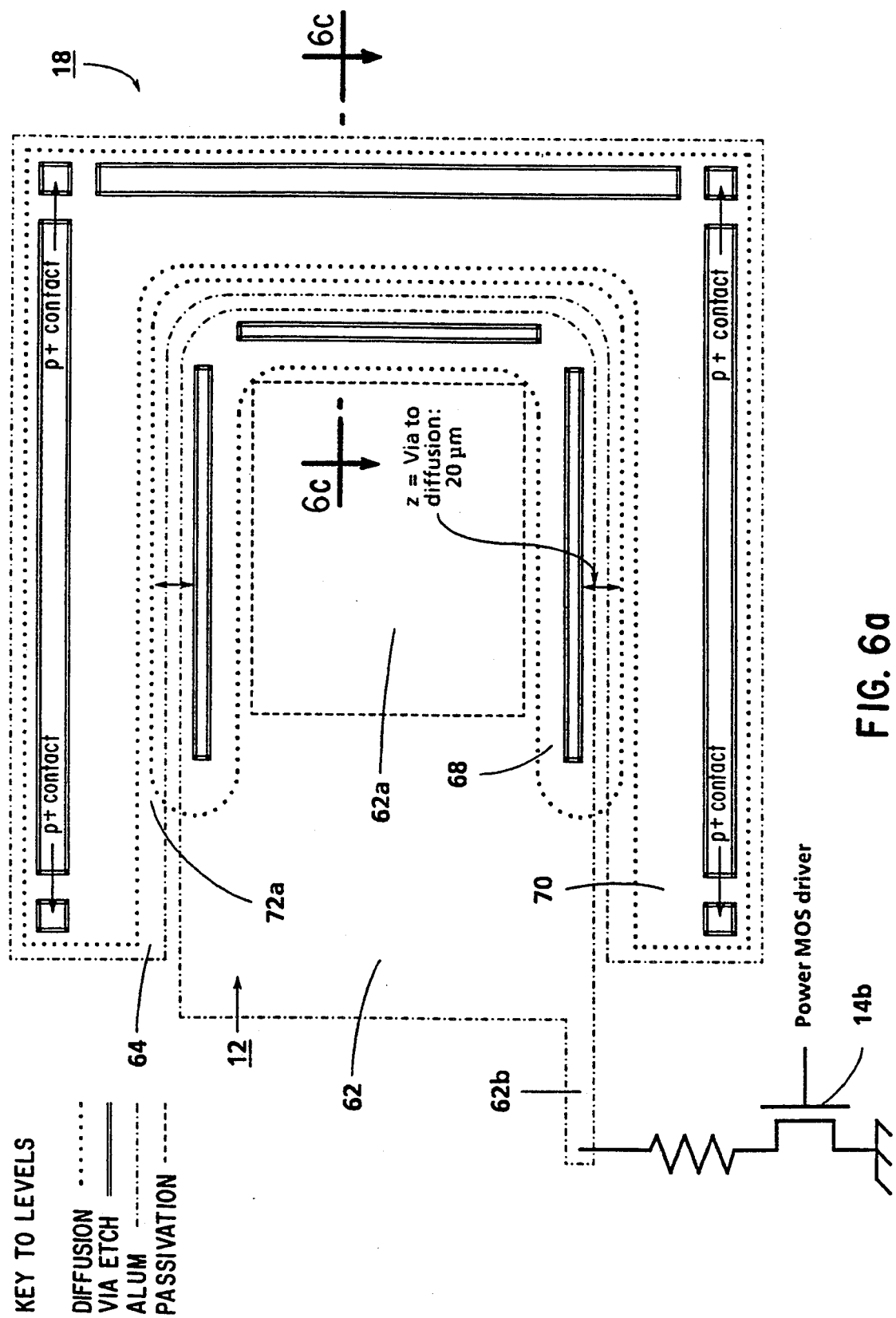
FIGS. 6a and 6b are plan views of the ESD protection device of the present invention.
Figure 6B:
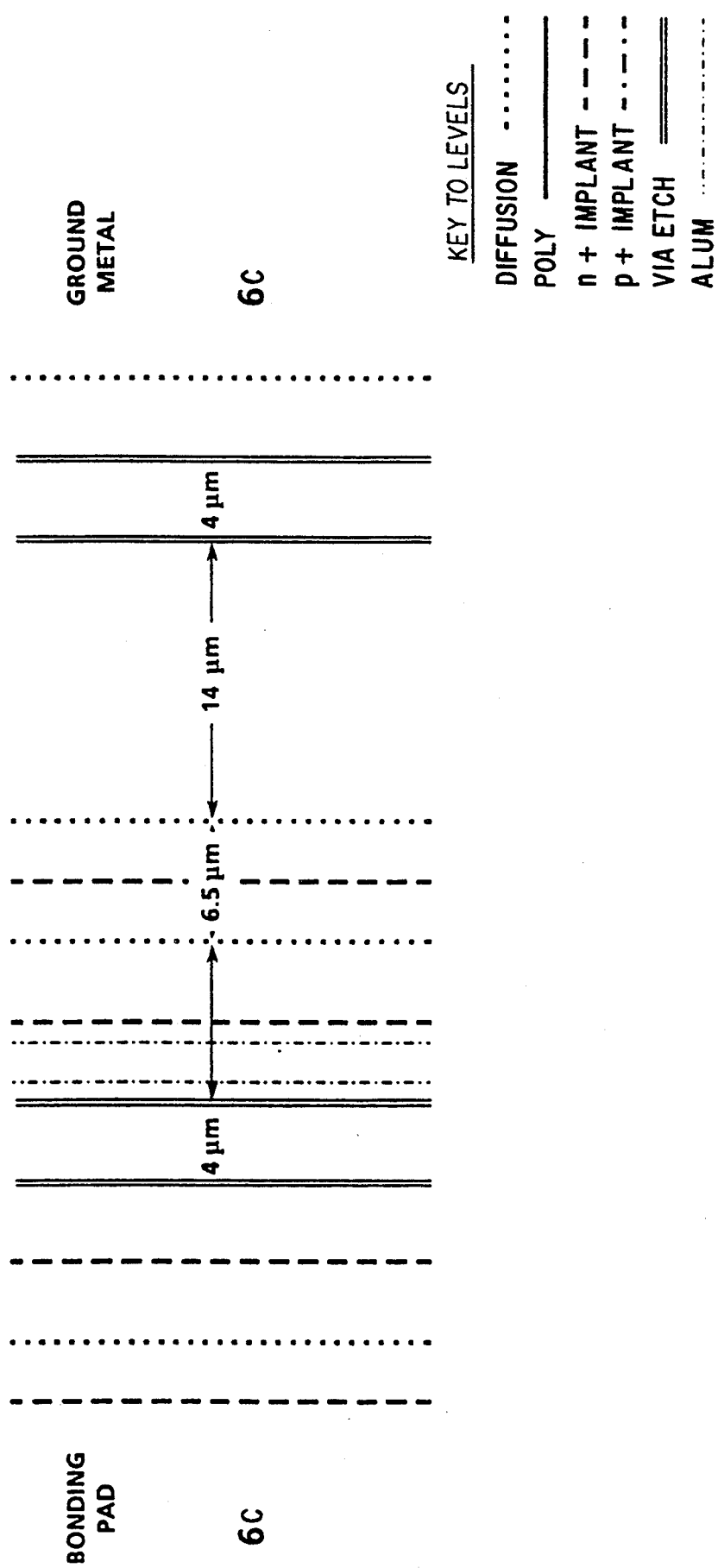

In the preferred embodiment, the circuit elements 14 are connected in parallel between the parasitic input impedance 16 and ground, while the impedance 16 is connected in serial to input pad 12. Within each circuit element 14, the load 14a is connected in series with the drain of the power MOS driver 14b. The source of the power MOS driver 14b is connected to ground and the gate of power MOS driver 14b is connected to a control circuit 19 (not shown in detail). In the preferred embodiment, the ESD protection device 18 of the present invention is also connected in parallel with the circuit elements 14 between the impedance 16 and ground. In the preferred embodiment, the ESD protection device 18 is a thick oxide transistor, as shown in FIGS. 6a and 6b.

Electrostatic discharge (ESD) events occur when a person's body becomes highly charged and the individual then touches a grounded object and discharges. The discharge is very similar to the discharge of a capacitor. It can be anticipated that ESD events depend on many variables. Electrical engineers have studied ESD events and developed a model called the "Human Body Model (HBM)". An HBM ESD event is simulated by discharging a 100 pF capacitor through 1.5 kΩ resistance, and the time constant for discharge is about 150 nsec. Therefore, the ESD event is of short duration and high current flow. ESD testing of a device would typically consist of charging up the capacitor to increasingly higher voltages and discharging it through the device until the device fails.

FIGS. 2 and 3 show a plan and sectional view of the layout of one power MOS driver of a 300 spot per inch (SPI) thermal ink jet printhead. In the thermal ink jet printhead of the present invention, and in most integrated circuit power devices, a high transistor packing density is desirable in order to minimize the chip area consumed. The source 22 and the drain 24 are connected to the source metalization layer 28 and the drain metalization layer 30, respectively, through the vias 34. Therefore, the aluminum drain contacts vias 34 must be made close to the drift region 25, as shown in FIGS. 2 and 3. As shown in FIG. 2, the space in between a via 34 and the gate 26 is only 7 μm. In higher resolution printheads (e.g. 400 spi), the spacing will be even closer.

In order to get the most transconductance in a given chip surface area, it is common in most power MOS designs to place the vias 34 next to an gate 26. As a result, if a power MOS device undergoes an electrostatic discharge event, an ESD-induced avalanche breakdown and ensueing high current flow will occur near the metal contacts. When such a breakdown event occurs, the aluminum-silicon eutectic temperature of 575° C. is reached at the contact, and aluminum will form a eutectic alloy through the n+ diffusion 24 and contact the substrate 20, thereby shorting out the drain.

Figure 4:
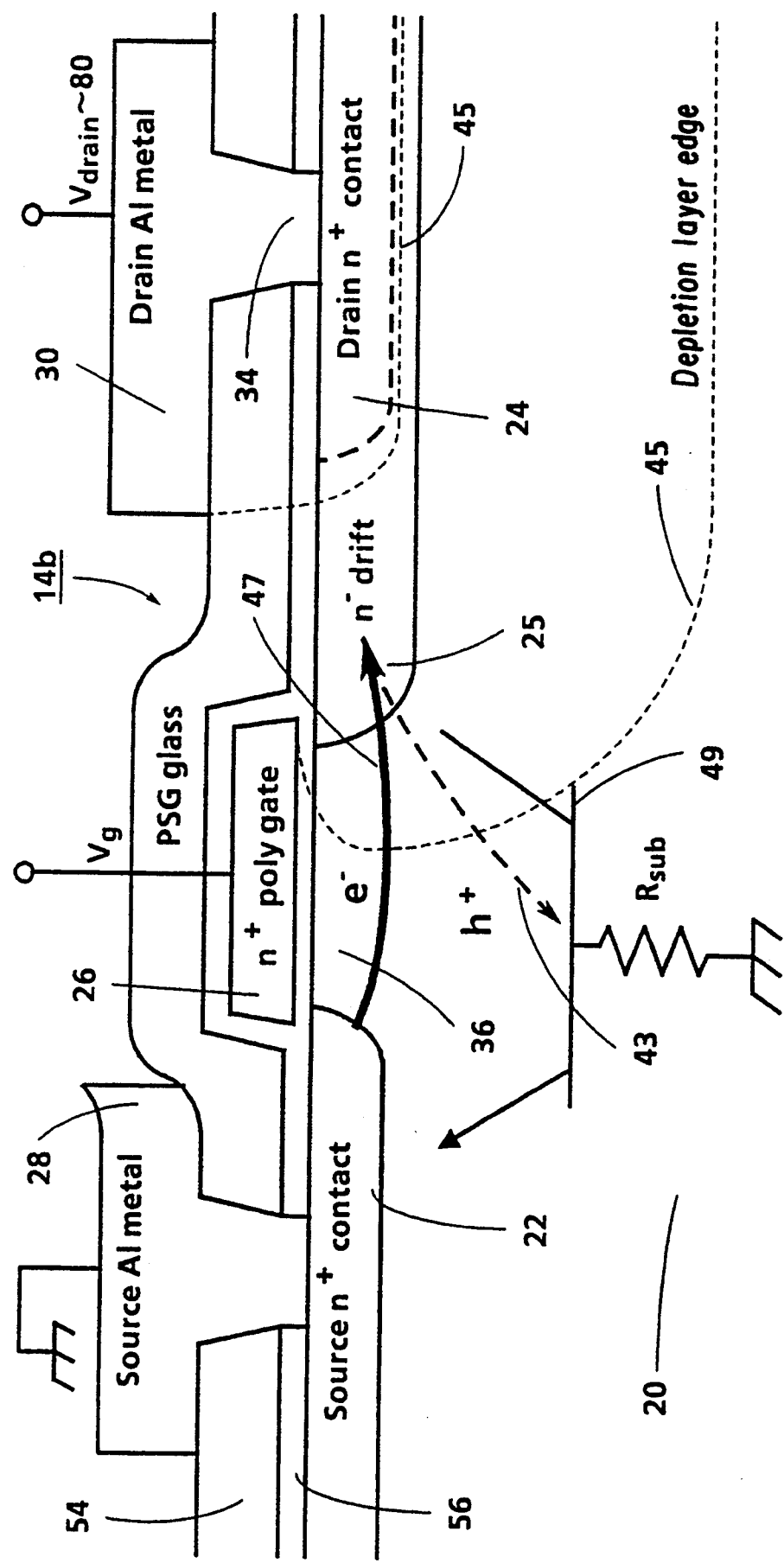
FIG. 4 is a cross sectional view of a power MOS driver through area 4—4 of FIG. 3 undergoing parasitic bipolar breakdown.
Figure 5:
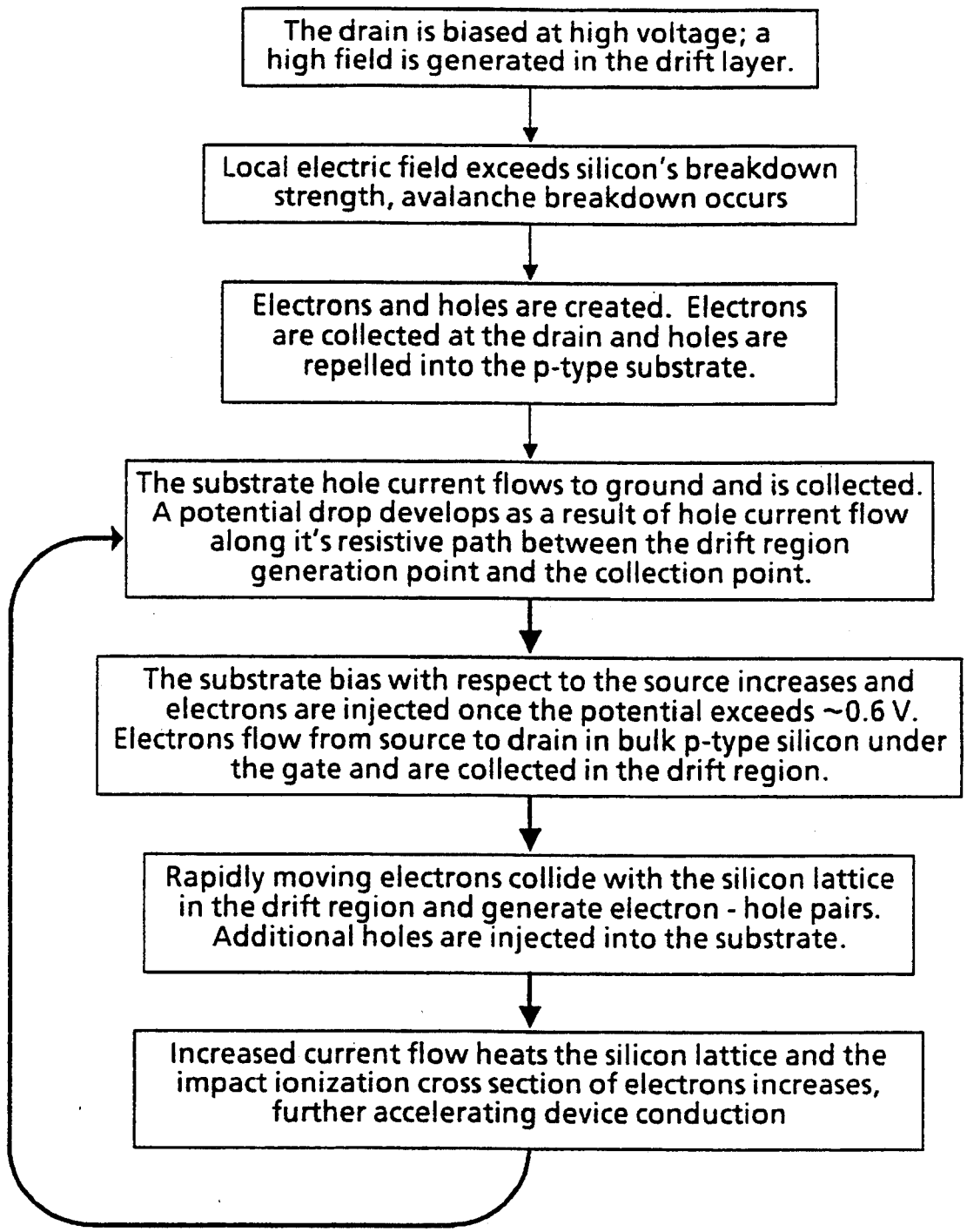
FIG. 5 is a flowchart showing the operation of the power MOS driver of FIG. 2 through 4 during an ESD event.

FIGS. 4 and 5 illustrate the breakdown mechanism. The breakdown mechanism is the same for both the power MOS drivers 14b and the ESD protection device 18. In an ESD event, avalanche breakdown of the drain junction caused by the ESD event will supply the initial carriers (i.e. turning the device "ON") necessary to start the feedback loop.

As shown in FIG. 4, during the ESD event, the drain 24, which is connected to the high voltage input pad 12 by metallization layer 30 is biased at a high voltage. The high voltage at the drain 24 depletes carriers in the drift region 25 and in the substrate 20. The depleted boundary regions 45 are also shown. A high electric field exists at the left edge of the drift layer 25. When the field exceeds the breakdown strength of silicon, avalanche breakdown begins. Electron-hole pairs are created at the edge of the drift region and electrons enter the drain 24. Once in the substrate, the holes 43 are drawn to ground, creating a substrate hole current. Due to the resistance $R_{sub}$ of the substrate, a potential appears between the substrate in the vicinity of the device 36 and ground. This causes substrate 36 to become forward-biased with respect to the source 22, thereby injecting (emitting) electrons 47 from the source into the substrate. These electrons then flow from the source to the drain through the substrate 36, are accelerated by a large electric field, and are collected in the drift region 25, thereby generating a bipolar conduction positive feedback loop. The sequence of steps in the feed back loop are shown in FIG. 5. The n-p-n parasitic bipolar element 49 is schematically shown. The positive feedback loop will continue, heating the device as it runs, until the drain is shorted out, destroying the device. The tight packing of the power MOS devices require contacts 34 between metal 30 and diffusion 24 to be close to the avalanche region. Heat can flow from the avalanche region to the contacts during the ESD event. FIG. 6a refers to the ESD protection device 18. Likewise, in the ESD protection device 18, the positive feedback loop will form between the first and second diffusion regions 68 and 70, the channel stop region 72a and the substrate 60.

In the present invention, the bipolar feedback loop is suppressed in the power MOS circuit by locating the input protection device 18 in parallel with the power MOS drivers 14b. The protection device 18 is designed to have a lower breakdown point so that avalanche breakdown in the power MOS drivers is prevented. The ESD protection device 18 is also designed to survive the bipolar feedback loop by placing the high voltage input pad metallization via contact 80 further away from the avalanche region to prevent eutectic alloying and junction spiking from occurring. The structure of the protection device 18 is shown in FIGS. 6a-6c.

In FIG. 6a, the input terminal 62 of the metallization layer has an input contact pad 62a and a lead region 62b connected to the protected circuit 14. Region 64 of the metallization layer connects the three independent lobes of the protection circuit 18 to ground. Each lobe of the protection circuit 18 is an independent protection device for protecting multiple blocks of 2 or more circuits 14. FIG. 6b shows a top view of the input terminal 12 and the protection circuit 18 of the lobe of the protection device 18. FIG. 6c shows the sectional view through the (6c—6c) lobe.

Figure 6C:
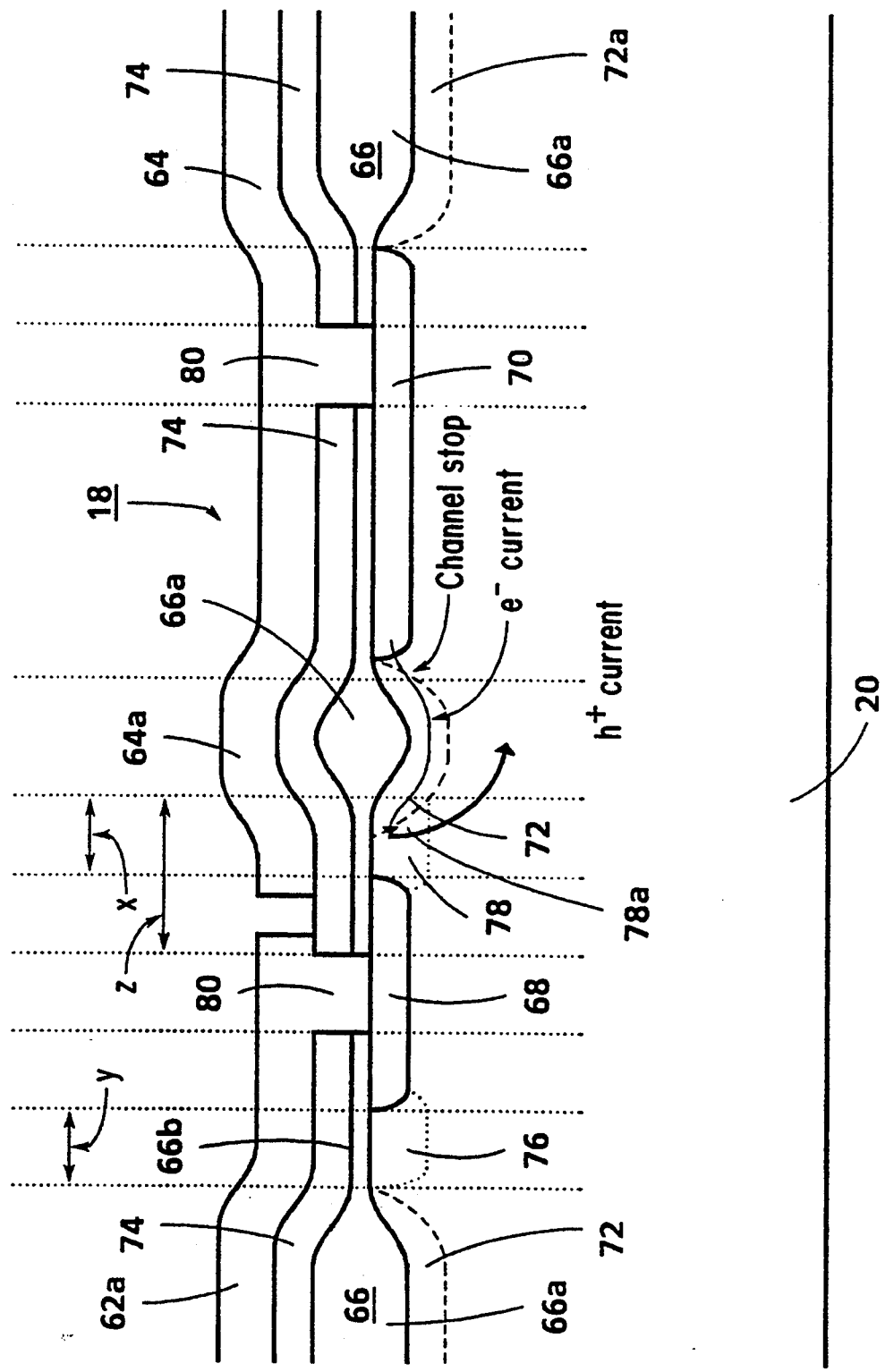

As shown in FIG. 6c, in the preferred embodiment the substrate 20, in the regions containing the active device 14 and the protection device 18, comprises a lightly p-doped region. The substrate 20 also has a first n+ diffusion region 68 connected to the input terminal pad 62a and a second n+ diffusion region 70 connected to the ground metallization layer 64 through vias 80. Lying atop the first and second n+ diffusion regions 68 and 70 is an oxide region 66b and a phosphorosilicate glass (PSG) layer 74. The first n+ diffusion region 68 is electrically isolated from the second n+ diffusion region 70 by a field oxide 66a and a channel stop 72 of the substrate 20.

Figure 8:
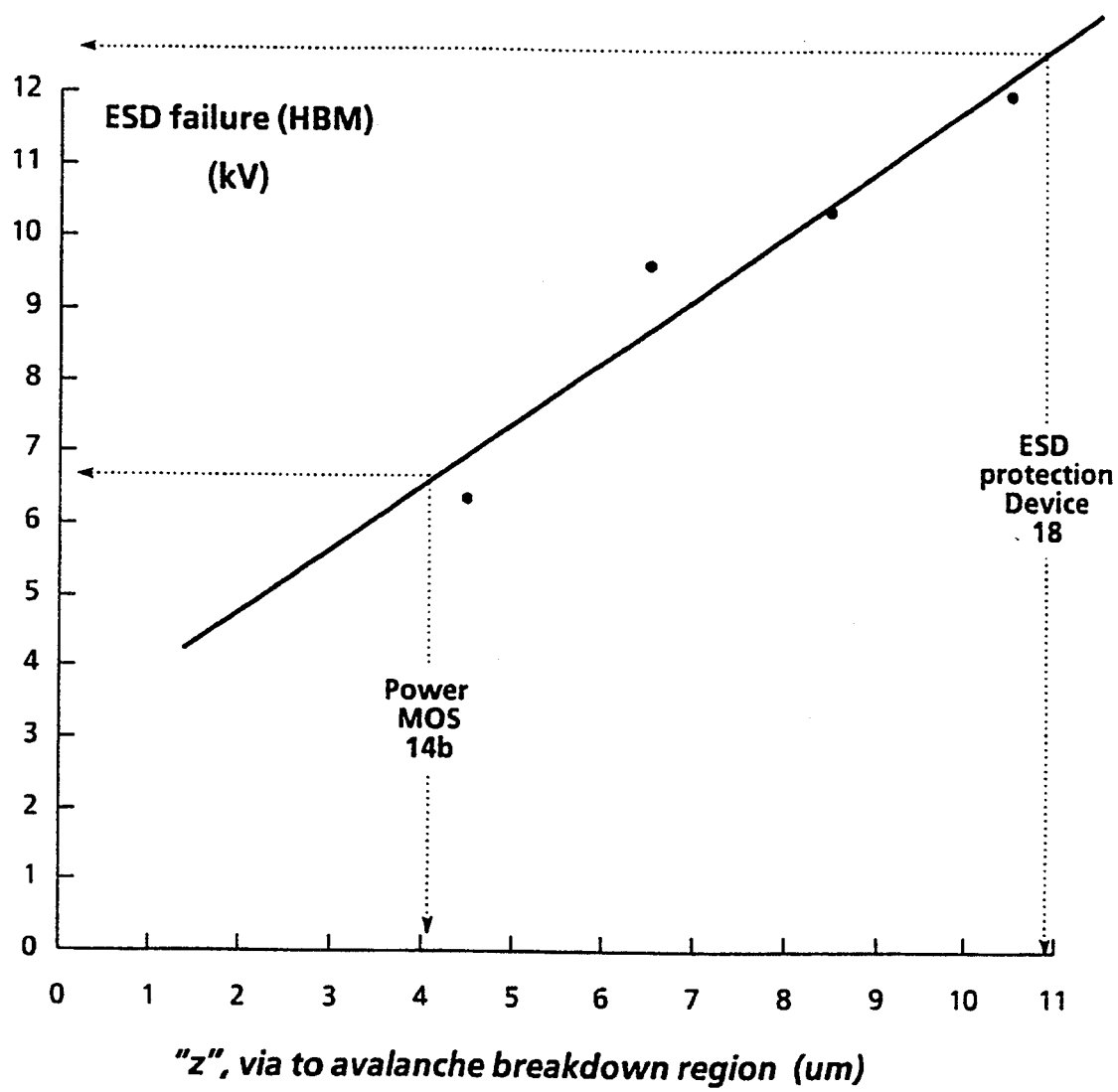
FIG. 8 is a graph of the ESD hardness of high voltage and power MOS drains as a function of spacing between metal vias and the breakdown region.

As shown in FIG. 6c, the oxide layer 66 has a first or source-drain reoxidized region 66b when lying over the first or second n+ diffusion regions 68 and 70 and has a second or field oxide region 66a extending over the substrate 20. The regions 66a of oxide layer 66 are located to the left of first n+ diffusion region 68, to the right of the second n+ diffusion region 70, and in the region 72 lying between the first and second n+ diffusion regions 68 and 70. In the substrate below at least the center thick field oxide layer 66a, a moderately doped p region 72 is formed in the substrate 20 as a channel stop region. Such moderately doped p channel stop regions 72 may also be formed in the substrate below the left and right thickened field oxide regions 66a. The central p channel stop region 72 is separated from the first n+ diffusion region 68 by a first n− drift region 78. Likewise, the leftmost p channel stop region 72 may be separated from the first n+ diffusion region 68 by a second n− drift region 76. In contrast, the second n+ diffusion region 70 abuts the central p channel stop region 72 and the rightmost p channel stop region 72. The spacing between the aluminum contact 80 and avalanche breakdown region 78a is shown in FIG. 6c as dimension "z". FIG. 8 shows the ESD hardness of the ESD protection device as a function of "z". Power MOS ESD hardness is also shown in FIG. 8. It can be seen that the close via spacing in the power MOS device results in low ESD hardness, while the large via spacing in the ESD protection device provides high ESD hardness. Because the ESD protection device takes up small area, there is little penalty for the via spacing used, while there would be a large penalty paid for such a large spacing in the power MOS devices.

In the preferred embodiment, the power MOS device(s) 14b to be protected have drains 24 made of n+ diffusion. High drain breakdown is achieved by a spacing the drain 24 away from the polysilicon gate electrodes 26 by a lightly doped drift region 25. The drift region 25 abuts the silicon region below the gate electrode 26, where a p-type threshold adjustment implant 36 is located. The source 22 is also constructed of n+ diffusion and surrounds the drain region 24. The power MOS device described here would be a "pull down" device and the source is therefore always at ground. Alternative configurations would have the same drain structure but alternative source configurations. An offset gate lateral power MOS is used here for illustration, but the invention is more generally applicable to a variety of power device designs such as DMOS, bipolar, and others. The objective of the present invention is to assure that the power MOS devices 14b breakdown at a higher voltage than the ESD protection circuitry 18. This is assured by using the same n− doping for the drift layer 25 of the power MOS device 14b as for the drift layer 78 of the ESD protection circuitry 18, by making the drift layer 36 of the power MOS driver 14b have a lateral dimension equal to or greater than the lateral dimension of the drift layer 78 of the ESD circuitry 18 and by abutting the drift layer 78 of the ESD protection device 18 to a more heavily doped p-type region than the threshold adjustment doping 36 which is present in the power MOS devices. The ESD protection device 18 abuts to the channel stop implant p-type region 72 and the power MOS driver 14b abuts to the threshold adjustment implant 36.

In a second preferred embodiment, the general power MOS driver circuit is in particular a power NMOS driver circuit which is suitable for integration with an NMOS logic process architecture. In this circuit, the n− drift region 78 of the protection device 18 has a masked n-type depletion implant added to it. The depletion implant converts logic devices to be normally "ON" instead of normally "OFF". By adding the depletion implant only to the n− drift region 78, the effective drift layer becomes more highly doped n− type in the ESD protection circuit 18 only. This assures that the ESD protection device 18 will breakdown prior to the power MOS drivers 14b.

In the second preferred embodiment, the depletion implant extends across the entire lateral dimension of the n− drift region 78 between the first n+ diffusion region 68 and the central p+ channel stop region 72. In a third preferred embodiment, the depletion implant extends only partially across the via dimension of the n− drift region 78. In this case, depletion doping is added to the half of the drift layer 78 adjacent to diffusion 68. An added advantage of the second and third embodiments is that the depletion implant can be added without any additional cost or processing time, because a depletion implant level mask is already required by the normal chip manufacturing process. Since the circuit itself requires a depletion processing step, the depletion implant can be added merely for the cost of altering the mask.

In a fourth preferred embodiment, a lower resistance n− drift region is substituted in the ESD circuit 18 for the original n− drift region 78 while the relatively higher original resistance of the drift layer 25 of the power MOS devices 14b is retained. However, this fourth embodiment has the disadvantage of requiring an additional mask and processing step, which are necessary to create the lower resistance drift region. In a fifth preferred embodiment, the well-technology disclosed by Yamamura and Minato et al. can be incorporated into the ESD protective circuit 18 of the present invention when CMOS-type power MOS drivers are used. However, this embodiment suffers the same problems as the fourth preferred embodiment, in that additional masks and processing steps will be required. Additional masks and processing steps will undesirably raise both the cost and the complexity of chip manufacturing.

In a sixth preferred embodiment, the lateral dimension of the n− drift region 78 of the ESD protective circuit 18, represented by the dimension X of FIG. 6c, is made shorter than the lateral dimension of the n− drift region 25 of the power MOS driver, as shown in FIG. 3. Because power MOS drivers such as the one shown in FIG. 3 operate at a high voltage, the n− drift layer 25 is several microns long. Therefore it is simple to make the n− drift region 78 of the protective circuit 18 several microns shorter. For example, in the power MOS driver of the preferred embodiment, the n− drift layer 25 can be made 4–5 μm long, while the n− drift layer 78 of the protection device 18 can be made 3–4 μm. When the drift layer is made shorter, the potential gradient through it is higher and the avalanche breakdown point is lower.

Figure 6D:
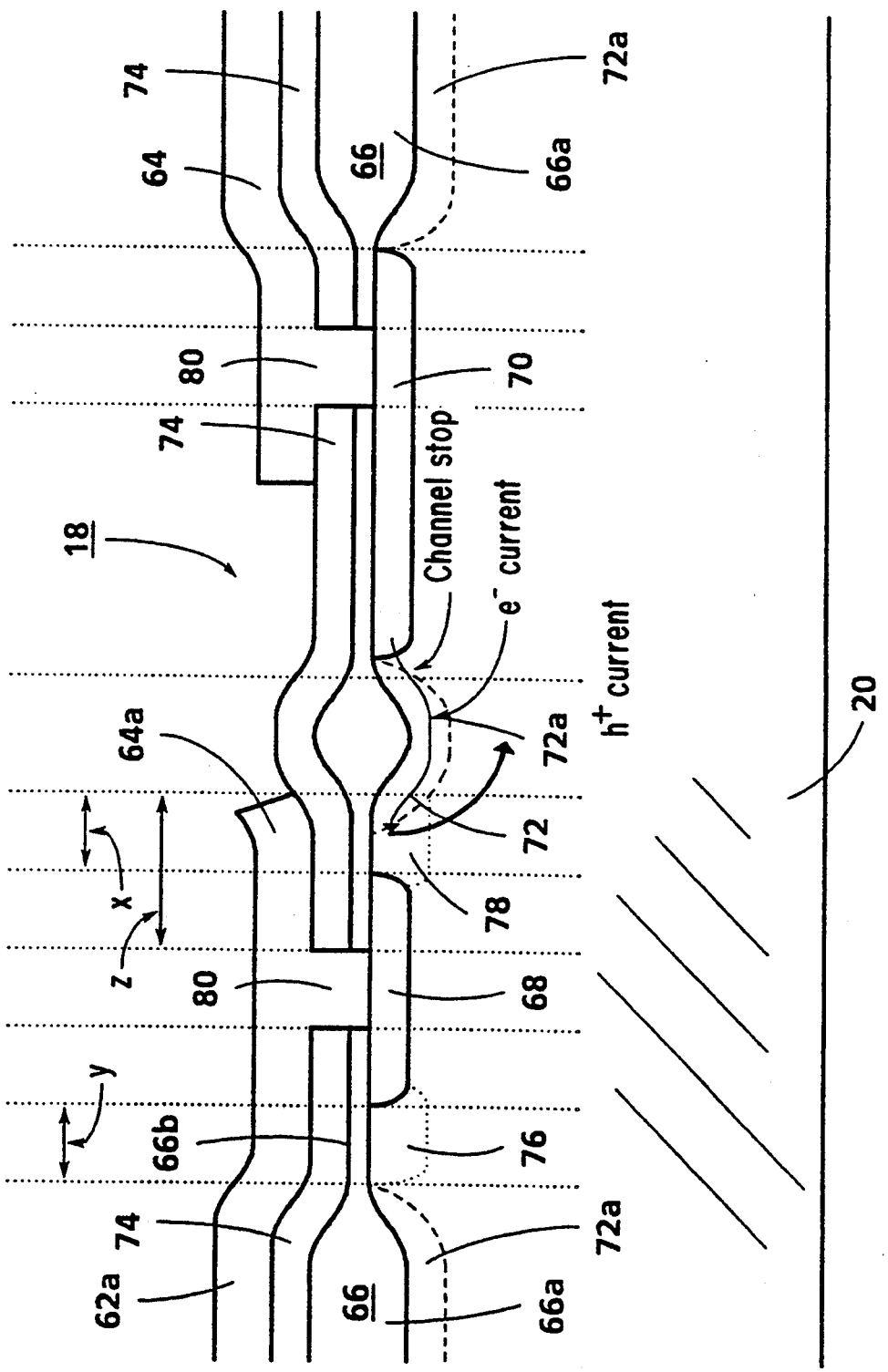
FIG. 6d is a cross-sectional view of the ESD protection device of one embodiment of the present invention.

In a seventh preferred embodiment, the metallization layer 62a, which connects the first n+ diffusion region 68 to the input pad 62 is extended to lie over the n− drift layer 78. As shown in FIG. 6d, this extension or field plate 64a can be easily added during the normal metallization step by simply altering the metallization layer mask. Similarly, as shown in FIG. 6c, the field plate 64a can be attached to the ground connection layer 64 instead of the input terminal pad 62a. When the added metallization area 64a is connected to the input terminal pad 62a, the drift layer will accumulate and cause breakdown at a lower voltage. Accumulation of the drift layer will cause the ESD protection device to breakdown at a lower voltage, but has the undesirable effect of attracting hot electrons toward the $SiO_2$ interface. An alternative and preferable configuration is to repel hot electrons by attaching the field plate 64a to ground metallization 64.

In an eighth preferred embodiment, the n⁻ drift region 78 is buried so that the peak n-type dopant concentration is below the surface level of the substrate 20. The effect of the eighth embodiment is to move the avalanche breakdown point 78a away from the silicon-field oxide interface.

In a further embodiment, the high voltage input terminal is electrically isolated from the substrate by a dielectric insulation such as silicon dioxide ($SiO_2$). Additionally, the region of the degenerately doped silicon surrounds or abuts the high voltage input terminal. The input terminal is electrically connected through a circuit path to the region of degenerating doped silicon. The lightly doped n⁻ drift region is positioned relative to the degenerately doped silicon region so as to sit around the degenerately doped silicon region in at least a lateral direction. The n⁻ drift region in this embodiment has a sheet resistance of at least one $k\Omega/\square$ and a width of at least two microns. The n⁻ drift region is further aligned to the oppositely doped semiconductor layer. In this way, the physical dimension of the n⁻ drift layer is arranged to ensure that the protection device 18 breaks down before the active device 14 breaks down.

Figure 7:
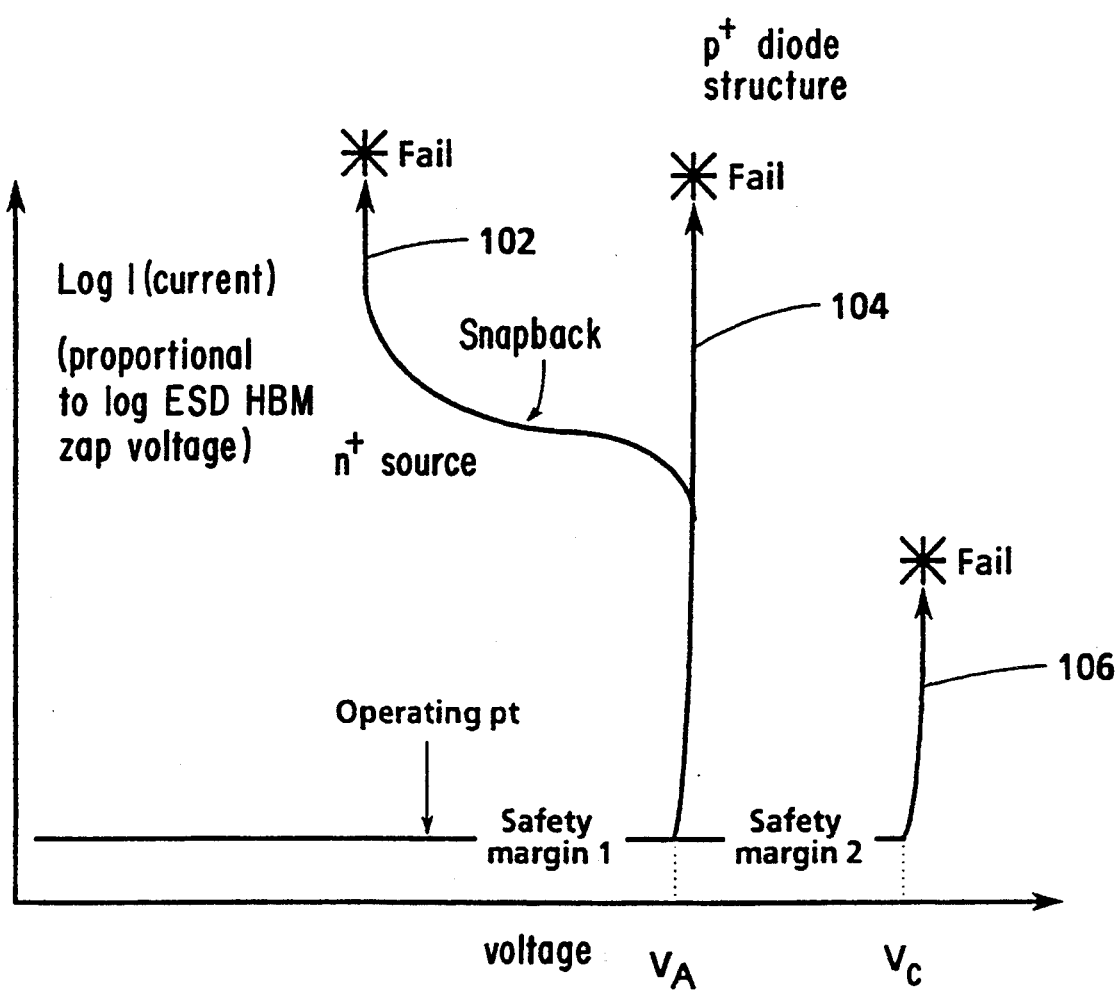
FIG. 7 is a graph of the operation of the present invention.

Finally, a ninth preferred embodiment uses a p+ doping of the substrate to form the second diffusion region 70 instead of the n+ doping used in the previous embodiments. By using a p+ diffusion region 70, a Zener diode is formed rather than a bipolar transistor. As shown in FIG. 7, the bipolar transistor follows the curve 102 as voltage rises above the breakdown point $V_A$. The curve 102 is called a "snapback" curve and indicates that after breakdown, the bipolar transistor embodiments 1-8 have a reduced voltage drop across the protection circuit as current increases. A disadvantage of bipolar action is that the resultant ESD circuit may exhibit thermal runaway in a small region before other segments can conduct. This problem will occur, for example, if one of the three modules in 18 has a lower $V_A$ than the others. In contrast, while the Zener diode of embodiment 9 has an identical breakdown point $V_A$, it follows the curve 104. As the Zener diode form experiences no snapback, it is able to provide a more robust protection circuit than the bipolar transistor embodiments for the case where parasitic bipolar gain is nonuniform. However, the Zener diode requires another processing step to provide the p+ doping. The p+ layer may be available as a substrate contact. The ninth embodiment can be combined with any of the previous embodiments to further improve the performance of the ninth embodiment.

While this invention has been described in conjunction with the specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and the scope of the invention as defined in the following claims.

What is claimed is:

1. An overvoltage protection device for protecting a circuit having a high voltage input terminal, comprising:
   a silicon substrate containing a lightly doped p region;
   the high voltage input terminal formed on the substrate;
   an n+ diffusion region provided in the lightly doped p region and connected to the high voltage input terminal;
   a p+ diffusion region provided in the substrate and connected to ground;
   a moderately doped p region provided in the lightly doped p region between the n+ diffusion region and the p+ diffusion region and adjacent the p+ diffusion region; and
   an n⁻ drift region located between the moderately doped p region and the n+ diffusion region.

2. The overvoltage protection device of claim 1, wherein the moderately doped p region is formed from channel stop doping.

3. The overvoltage protection device of claim 1, wherein the moderately doped p region is formed from threshold adjustment doping.

4. The overvoltage protection device of claim 1, further comprising a first metallization layer connecting the n+ diffusion region to the high voltage input terminal and a second metallization layer connecting the p+ diffusion region to ground, wherein the n⁻ drift region is located adjacent to at least the moderately doped p region and the second metallization layer comprises a field plate layer which lies over the n⁻ drift region.

5. The overvoltage protection device of claim 1 further comprising n⁻ depletion doping added to the n⁻ drift region adjacent to the moderately doped p region.

6. The overvoltage protection device of claim 5, wherein an n⁻ depletion region extends completely between the n+ diffusion region and the moderately doped p region.

7. The overvoltage protection device of claim 5, wherein an n⁻ depletion region extends only partially between the n+ diffusion region and the moderately doped p region.

8. The overvoltage protection device of claim 1, wherein the moderately doped p region comprises a channel stop implant and the n⁻ drift region abuts at least the channel stop implant of the overvoltage protection device.

9. The overvoltage protection device of claim 8, wherein the n⁻ drift region is formed in the substrate such that a peak doping concentration of the n⁻ drift region is below a surface of the substrate.

10. An overvoltage protection device for protecting a circuit having a high voltage input terminal, the circuit and the overvoltage protection device formed in a silicon substrate, the overvoltage protection device comprising:
    a lightly doped p region formed in the substrate;
    a first n+ diffusion region provided in the lightly doped p region and connected to the high voltage input terminal;
    a second n+ diffusion region connected to ground and provided in the substrate;
    a moderately doped p-type channel stop region provided in the lightly doped p region and located between the first and second n+ diffusion regions adjacent the second n+ diffusion region;

a first n⁻ drift region located between the channel stop region and the first n+ diffusion region;

a thin oxide layer provided above the first and second n+ diffusion regions and the first n⁻ drift region; and a thickened field oxide region provided only above the channel stop region and located adjacent to an edge of the first n⁻ drift region, the first n⁻ drift region and the channel stop region forming an electrical junction such that the overvoltage protection device has a breakdown voltage less than a damage threshold voltage of the protected circuit.

11. The overvoltage protection device of claim 10, wherein the first n⁻ drift region has a first sheet resistance, and the protected circuit comprising a second n⁻ drift region having a second sheet resistance greater than the first sheet resistance.

12. The overvoltage protection device of claim 10, further comprising a first metalization layer connecting the first n+ diffusion region to the high voltage input terminal and a second metallization layer connecting the second n+ diffusion region to ground.

13. The overvoltage protection device of claim 12, wherein a field plate layer is connected to the second metallization layer.

14. The overvoltage protection device of claim 10, wherein the first n⁻ drift region has a first lateral dimension and wherein the protected circuit comprises a second n⁻ drift region having a second lateral dimension, the first lateral dimension being less than the second lateral dimension.

15. The overvoltage protection device of claim 10, wherein the first n⁻ drift region is formed in the lightly doped p region such that a peak doping concentration of the first n⁻ drift region is below a surface of the substrate.

16. An overvoltage protection device for protecting a circuit having a high voltage input terminal, comprising:

a silicon substrate with at least one p⁻ region;

a first n+ diffusion region in the substrate connected to the high voltage input terminal;

a second n+ diffusion region in the substrate connected to ground;

a moderately doped channel stop region in the substrate, laterally separating the second n+ diffusion region from the first n+ diffusion region;

an oxide layer above the first and second n+ diffusion regions and the moderately doped channel stop region, having a first thickened region over the channel stop region and a second thickened region;

a high voltage input terminal formed on the oxide layer in an area over the second thickened region; and at least one n⁻ drift region located between the moderately doped channel stop region and the first n+ diffusion region, wherein the at least one n⁻ drift region is formed in the substrate such that the peak doping concentration of the at least one n⁻ drift region is below a surface of the substrate.

17. An electronic apparatus comprising a monolithically integrated, electrostatic sensitive component having a power input terminal, an electrostatic discharge (ESD) protection device connected to the power input terminal for ESD protection of the electrostatic sensitive component and a high voltage and minimal impedance connection to a power supply, wherein the ESD device comprises;

a silicon substrate with at least a lightly doped region in the area where ESD circuitry will be fabricated;

at least one input terminal which is connected to said electrostatic sensitive component through a resistance of less than 100 ohms;

a degenerate region of degenerately doped silicon of one conductivity type formed in the substrate and connected to the input terminal;

a lightly doped drift region of the one conductivity type formed in the substrate having a sheet resistance of at least 1 kohm/square and a width of at least two microns which surrounds the degenerate region at least laterally and is aligned to an opposite conductivity semiconductor layer, the doping and dimension of the drift layer and opposite conductivity semiconductor layer being selected such that the avalanche breakdown in the ESD protection device occurs above a circuit operating voltage of the electrostatic sensitive component and below a damage threshold of the electrostatic sensitive component to be protected;

and a conductive region for conducting the ESD transient current to ground prior to destruction of said monolithically integrated, electrostatic sensitive component, the conductive region formed in the substrate and having a different conductivity type from the conductivity type of the degenerate region, such that the ESD conduction to ground is by reverse bias breakdown, zener diode conduction.

18. The electronic apparatus of claim 17, wherein the electrostatic sensitive component is an offset gate power MOS driver comprising a drift layer formed in the same processing steps with the lightly doped drift region of the ESD protection device.

19. The electronic apparatus of claim 18, wherein the power MOS drift layer self aligns to a polysilicon gate and the lightly doped drift region of the ESD protection device abuts to the opposite conductivity semiconductor layer to ensure that the ESD device breaks down first.

20. The electronic apparatus of claim 17, wherein a grounded electrode is placed over the lightly doped drift region such that hot carriers generated by avalanche breakdown and impact ionization are repelled from a silicon—silicon dioxide interface.

* * * * *